United States Patent
Song et al.

(10) Patent No.: US 11,849,602 B2
(45) Date of Patent: Dec. 19, 2023

(54) ORGANIC LIGHT EMITTING DISPLAY DEVICE

(71) Applicants: LG DISPLAY CO., LTD., Seoul (KR); INDUSTRY-ACADEMIC COOPERATION FOUNDATION, YONSEI UNIVERSITY, Seoul (KR)

(72) Inventors: Jaebin Song, Seoul (KR); Dawoon Jeong, Incheon (KR); SungHee Kim, Paju-si (KR); Suyeon Lee, Seoul (KR); JaeMin Myoung, Goyang-si (KR); Sung-Doo Baek, Seoul (KR); MinSeong Kim, Seoul (KR)

(73) Assignees: LG Display Co., Ltd., Seoul (KR); INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 260 days.

(21) Appl. No.: 17/494,612

(22) Filed: Oct. 5, 2021

(65) Prior Publication Data

US 2022/0123263 A1    Apr. 21, 2022

(30) Foreign Application Priority Data

Oct. 21, 2020  (KR) .......................... 10-2020-0137019

(51) Int. Cl.
| | |
|---|---|
| *H01L 51/50* | (2006.01) |
| *H10K 50/84* | (2023.01) |
| *B01J 20/04* | (2006.01) |
| *B01J 20/22* | (2006.01) |
| *B01J 20/32* | (2006.01) |

(Continued)

(52) U.S. Cl.
CPC .......... *H10K 50/846* (2023.02); *B01J 20/041* (2013.01); *B01J 20/22* (2013.01); *B01J 20/28007* (2013.01); *B01J 20/28021* (2013.01); *B01J 20/3204* (2013.01); *B01J 20/3223* (2013.01); *B01J 20/3259* (2013.01); *B01J 20/3293* (2013.01); *H10K 50/8426* (2023.02); *H10K 85/40* (2023.02); *H10K 59/121* (2023.02); *H10K 85/141* (2023.02); *H10K 2102/00* (2023.02); *H10K 2102/331* (2023.02)

(58) Field of Classification Search
CPC ........................ H10K 50/846; H10K 50/8426
See application file for complete search history.

(56) References Cited

FOREIGN PATENT DOCUMENTS

| | | |
|---|---|---|
| KR | 10-2020-0025920 A | 3/2020 |
| KR | 10-2020-0081928 A | 7/2020 |

*Primary Examiner* — Anthony Ho
(74) *Attorney, Agent, or Firm* — Morgan, Lewis & Bockius LLP

(57) ABSTRACT

An organic light emitting display device may include a filling part filling a space between a second substrate and an organic light emitting diode, and a dam structure disposed in a non-display area and surrounding the filling part. At least one of the dam structure and the filling part includes a getter. The getter of the present disclosure is composed of magnesium oxide particles whose surfaces are modified into a first surface modification part made of an amino silane-based compound and a second surface modification part bound to the first surface modification part and made of a compound containing an acrylate group and a methacrylate group. Accordingly, it is possible to provide an organic light emitting display device that has high transparency and of which optical properties and durability are improved by minimizing permeation of water and oxygen.

13 Claims, 14 Drawing Sheets

(51) Int. Cl.
B01J 20/28 (2006.01)
H10K 50/842 (2023.01)
H10K 85/40 (2023.01)
H10K 59/121 (2023.01)
H10K 85/10 (2023.01)
H10K 102/00 (2023.01)

ORGANIC LIGHT EMITTING DISPLAY DEVICE

CROSS-REFERENCE TO RELATED APPLICATIONS

This application claims the priority of Korean Patent Application No. 10-2020-0137019 filed on Oct. 21, 2020 in the Korean Intellectual Property Office, the disclosure of which is incorporated herein by reference.

BACKGROUND

Technical Field

The present disclosure relates to an organic light emitting display device, and more particularly, to an organic light emitting display device which has high transparency and of which lifespan and durability are improved by minimizing permeation of water and oxygen.

Discussion of the Related Art

Recently, as the society enters an information society, a display field which visually represents an electrical information signal is rapidly being developed. In accordance with the rapid development, various display devices having excellent performance such as thin thickness, light weight, and low power consumption properties have been developed. Specific examples of the above-mentioned display device may include a liquid crystal display device (LCD), a plasma display panel device (PDP), a field emission display device (FED), an organic light emitting display device (OLED), and the like.

In particular, the organic light emitting display device is self-emissive and is more advantageous than the other display devices in view of a fast response time, high light emission efficiency, high luminance, and a high viewing angle. Therefore, the organic light emitting display device has widely received attention. Also, organic light emitting diodes applied to the organic light emitting display device are next-generation light sources having self-luminance characteristic. The organic light emitting diodes are better in viewing angle, contrast, response time and consumption power than a liquid crystal display device.

However, the organic light emitting diodes are based on organic materials and vulnerable to water or oxygen and thus are subject to reduction in lifespan and deterioration in reliability. Accordingly, in order to minimize deterioration of the organic light emitting diodes caused by water or oxygen, various technologies for sealing the organic light emitting diodes have been used.

Meanwhile, recently, demand for transparent organic light emitting display devices has been increased. In a transparent organic light emitting display device, an organic layers such as an emission layer and electrodes are formed transparent so that an object behind the display device can be viewed. In order to implement the transparent organic light emitting display device, materials sealing organic light emitting diodes as well as the organic layers and electrodes need to be transparent. Accordingly, there is a need for development of a sealing member that can minimize deterioration caused by water or oxygen and has high transparency.

SUMMARY

Accordingly, embodiments of the present disclosure are directed to an organic light emitting display device that substantially obviates one or more of the problems due to limitations and disadvantages of the related art.

An aspect of the present disclosure is to provide an organic light emitting display device with high transparency, minimized deterioration and improved lifespan and durability by using a getter. The getter is used as a dam structure disposed in a non-display area and/or a filling part filling a space between an organic light emitting diode and an upper substrate. The getter has excellent resistance to water and oxygen permeation and improved light transmittance.

Another aspect of the present disclosure is to provide an organic light emitting display device that may maintain the transparency due to no change in color before and after water absorption. The organic light emitting display device may maintain high resistance to water permeation for a long time because absorbed water or oxygen is not desorbed.

Yet another aspect of the present disclosure is to provide an organic light emitting display device that may maintain high transparency by improving the dispersibility of a getter in a base resin even when the amount of the getter contained in the base resin is increased.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, an organic light emitting display device comprises a first substrate which includes a plurality of sub-pixels and in which a display area and a non-display area that encloses the display area are defined. The organic light emitting display device further includes a thin film transistor disposed on the first substrate and an organic light emitting diode disposed on the thin film transistor. The organic light emitting display device also includes a second substrate facing the first substrate and a filling part filling a space between the second substrate and the organic light emitting diode. The organic light emitting display device further includes a dam structure disposed in the non-display area and surrounding the filling part. At least one of the dam structure and the filling part includes a getter. The getter is composed of magnesium oxide particles whose surfaces are modified into a first surface modification part made of an amino silane-based compound and a second surface modification part bound to the first surface modification part and made of a compound containing an acrylate group and a methacrylate group.

Other detailed matters of the exemplary embodiments are included in the detailed description and the drawings.

According to the present disclosure, a getter having excellent resistance to water and oxygen permeation and improved light transmittance is used to improve the transparency of an organic light emitting display device and minimize deterioration. Thus, the lifespan and durability of the organic light emitting display device may be improved.

According to the present disclosure, the getter, which does not change in color before and after water absorption and in which absorbed water or oxygen is not easily desorbed, is used. Thus, it is possible to provide an organic light emitting display device that is transparent and has high reliability.

According to the present disclosure, the dispersibility of the getter is improved through a chemical bond between the getter and a base resin. Thus, it is possible to provide an organic light emitting display device that has improved resistance to water permeation and transparency equivalent to or higher than that of conventional ones even when the amount of the getter is increased.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
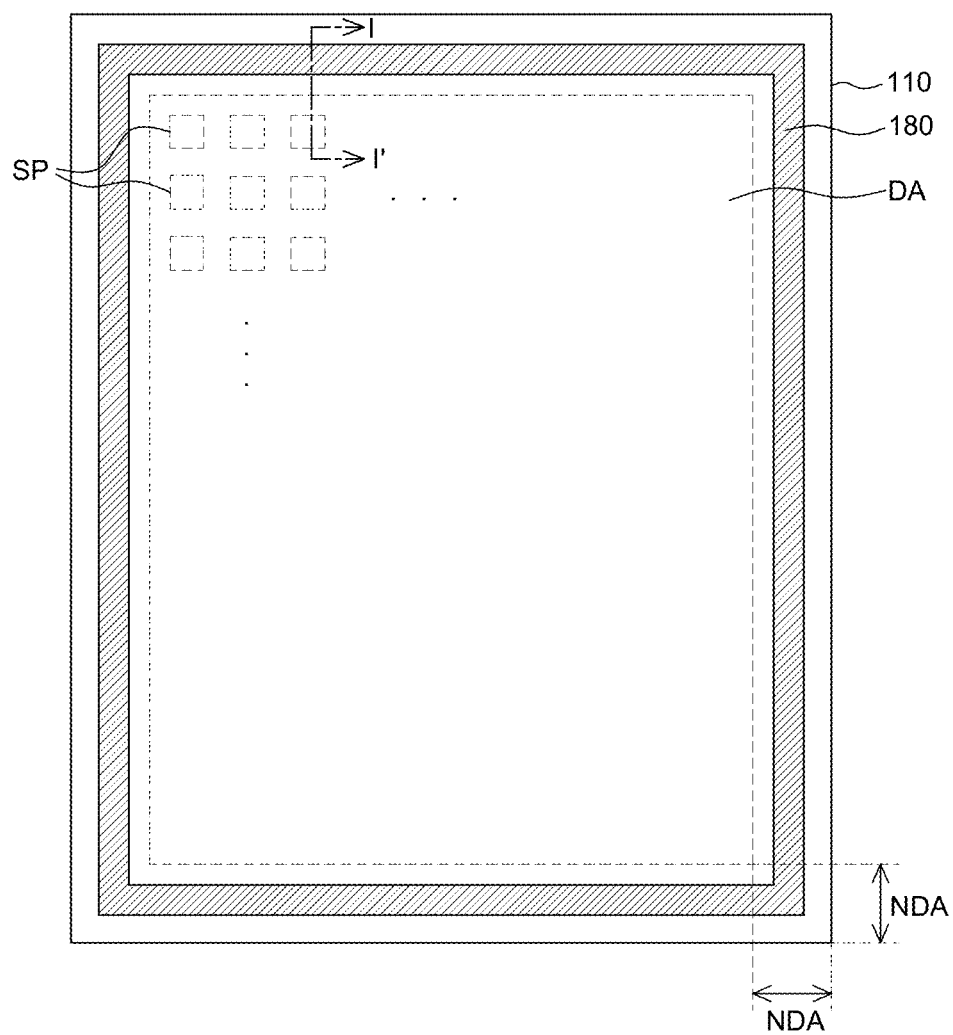
FIG. 1 is a schematic plan view provided to explain an organic light emitting display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

In this specification, a transparent display device refers to a transparent display device in which at least a part of a screen of a display device viewed by a user is transparent. In this specification, transparency of the transparent display device refers to a degree of transparency at which a user at least recognizes an object behind a display device. In this specification, the transparent display device refers to a transparent display device whose transmissivity is, for example, equal to or greater than at least 20%.

Hereinafter, an organic light emitting display device according to exemplary embodiments of the present disclosure will be described in detail with reference to accompanying drawings.

Figure 2:
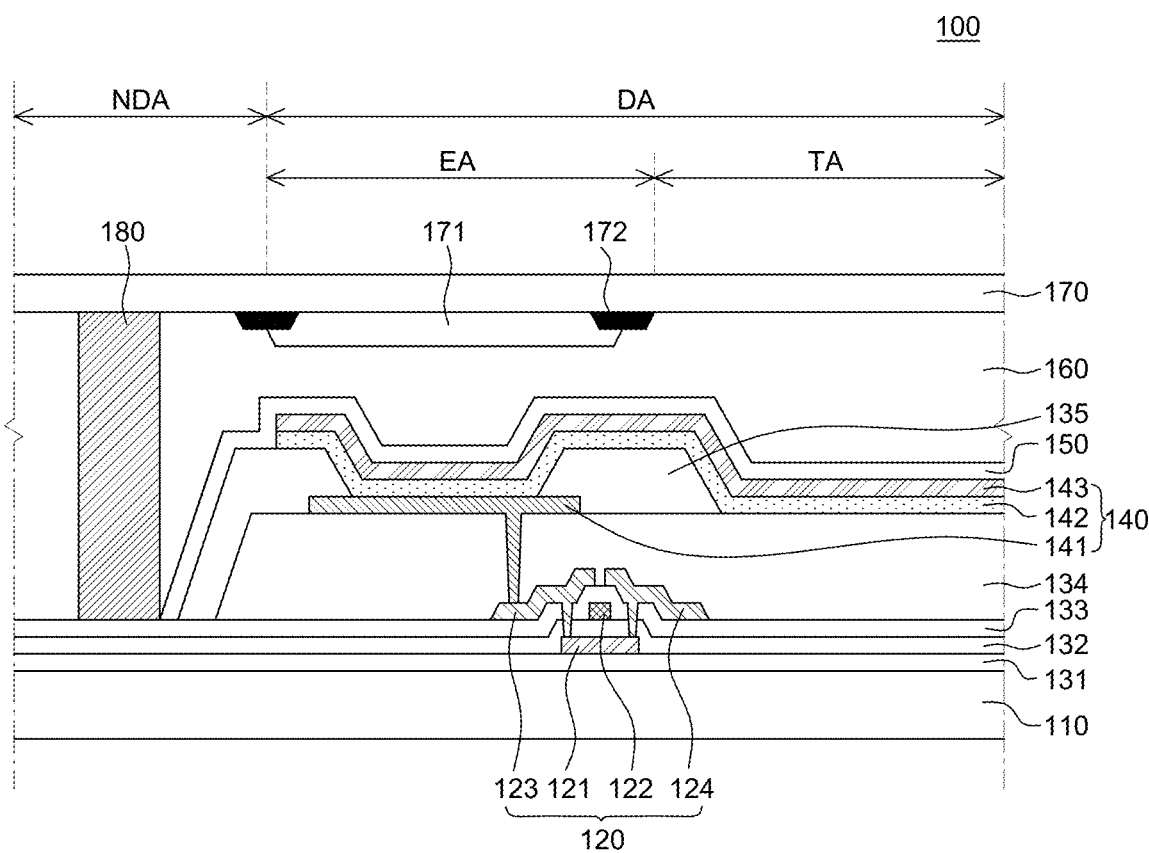
FIG. 2 is a schematic cross-sectional view as taken along a line I-I' of FIG. 1.

FIG. 1 is a schematic plan view provided to explain an organic light emitting display device according to an exemplary embodiment of the present disclosure. FIG. 2 is a schematic cross-sectional view as taken along a line I-I' of FIG. 1. FIG. 1 and FIG. 2 illustrate a transparent organic light emitting display device. Hereinafter, a transparent organic light emitting display device will be described, but the present disclosure is not limited thereto. The present disclosure may also be applied to an opaque organic light emitting display device whenever necessary.

Referring to FIG. 1 and FIG. 2, an organic light emitting display device 100 includes a first substrate 110, a thin film transistor 120, a white organic light emitting diode (OLED) 140, an encapsulation layer 150, a filling part 160, a second substrate 170 and a dam structure 180.

The first substrate 110 serves to support various components of the organic light emitting display device 100. Referring to FIG. 1, the first substrate 110 includes a display area DA and a non-display area NDA. The display area DA refers to an area where a plurality of pixels is disposed and images is displayed. In the display area DA, pixels including an emission area for displaying images and a driving circuit for driving the pixels may be disposed. The non-display area NDA refers to an outer peripheral area that encloses the display area DA. In the non-display area, images are not displayed. In the non-display area NDA, various wiring lines, driver integrated circuits (ICs) and printed circuit boards for driving the pixels and driving circuit disposed in the display area are disposed.

Referring to FIG. 1, a plurality of sub-pixels SP is disposed in the display area DA of the first substrate 110. Each of the plurality of sub-pixels SP is an area for displaying one color. A white OLED is disposed in each of the plurality of sub-pixels SP. The plurality of sub-pixels SP may include a red sub-pixel, a green sub-pixel and a blue sub-pixel, or may include a red sub-pixel, a green sub-pixel, a blue sub-pixel and a white sub-pixel. The plurality of sub-pixels SP may be defined in the form of a matrix as shown in FIG. 1.

Each of the plurality of sub-pixels SP of the organic light emitting display device 100 includes an emissive area EA and a transmissive area TA. The emissive area EA is an area configured to display images and not to transmit external light. The transmissive area TA is an area configured to transmit external light. Therefore, when the organic light emitting display device 100 is not driven, the user can view a background, i.e., an object behind a display, through the transmissive area TA. When the organic light emitting display device 100 is driven, the user can simultaneously view an image displayed in the emissive area EA and a background through the transmissive area TA. An area ratio between the emissive area EA and the transmissive area TA in each sub-pixel SP may be variously set in view of visibility and a transmittance.

As described above, FIG. 1 and FIG. 2 illustrate a transparent organic light emitting display device, but the present disclosure is not limited thereto. The present disclosure may also be applied to an opaque organic light emitting display device. The opaque organic light emitting display device may not have a transmissive area or may have a very small transmissive area.

The first substrate 110 may be made of an insulating material. The first substrate 110 may be glass substrate or a plastic substrate having flexibility. For example, the plastic substrate having flexibility may contain a material selected from polyimide, polyethersulfone, polyethylene terephthalate, polyetherimide, polymethylmethacrylate, polystyrene, styrene-acrylonitrile copolymer, silicon-acryl resin and polycarbonate. However, the present disclosure is not limited thereto.

A buffer layer 131 may be formed on the first substrate 110. The buffer layer 131 serves to protect various components of the organic light emitting display device 100 against permeation of water or oxygen and suppress introduction of impurities remaining on the first substrate 110. The buffer layer 131 may be made of, for example, silicon nitride (SiNx) or silicon oxide (SiOx), but is not limited thereto.

The buffer layer 131 may have a single layer structure or a multilayered structure. In particular, the plastic substrate has lower barrier properties than the glass substrate. Thus, the buffer layer 131 having a multilayered structure may be formed on the plastic substrate to secure resistance to water and oxygen permeation. Further, the buffer layer 131 may be omitted when there is little influence of external air, such as water, or impurities or depending on the structure of the organic light emitting display device 100.

The thin film transistor 120 including a gate electrode 121, an active layer 122, a source electrode 123 and a drain electrode 124 is disposed on the buffer layer 131. The thin film transistor 120 may be disposed in each of the plurality of sub-pixel areas. For the convenience of description, FIG. 2 illustrates only a driving thin film transistor among various thin film transistors which may be included in the organic light emitting display device 100. However, a switching thin film transistor, a capacitor or the like may also be included in the organic light emitting display device 100. Also, FIG. 2 illustrates the thin film transistor 120 has a staggered structure, but a thin film transistor having a coplanar structure may also be used.

The active layer 122 is formed on the first substrate 110, and a gate insulating layer 132 for insulating the active layer 122 from the gate electrode 121 is formed on the active layer 122. Also, an interlayer insulating layer 133 for insulating the gate electrode 121 from the source electrode 123 and the drain electrode 124 is formed. The source electrode 123 and the drain electrode 124 each in contact with the active layer 122 are formed on the interlayer insulating layer 133.

A planarization layer 134 is formed on the thin film transistor 120. The planarization layer 134 serves to flatten an upper part of the thin film transistor 120. The planarization layer 134 includes a contact hole for electrically connecting the thin film transistor 120 and an anode 141 of the white OLED 140. The planarization layer 134 may have a single layer structure or a multilayered structure and may be made of an organic insulating material. For example, the planarization layer 134 may be made of acrylic-based resin, but is not limited thereto.

A passivation layer may be selectively formed on the planarization layer 134 as necessary. The passivation layer may be made of an inorganic insulating material such as silicon nitride (SiNx) or silicon oxide (SiOx). Also, the passivation layer may have a single layer structure or a multilayered structure, but is not limited thereto.

The white OLED 140 is disposed on the planarization layer 134. The white OLED 140 is electrically connected to the thin film transistor 120, and includes the anode 141, a white organic emission layer 142 and a cathode 143. The white OLED 140 is driven to display an image through recombinations between holes from the anode 141 and electrons from the cathode 143 in the white organic emission layer 142.

The anode 141 is disposed on the planarization layer 134. The anode 141 may be made of a material having a high work function to supply holes into the white organic emission layer 142. For example, the anode 141 may be made of a transparent conductive material such as indium tin oxide (ITO), indium zinc oxide (IZO) or indium tin zinc oxide (ITZO), but is not limited thereto. If the organic light emitting display device 100 is of a top-emission type, the anode 141 may further include a reflective layer.

The anode 141 is electrically connected to the thin film transistor 120 through the contact hole of the planarization layer 134. For example, FIG. 2 illustrates that the anode 141 is electrically connected to the source electrode 123 of the thin film transistor 120, but the anode 141 may be electrically connected to the drain electrode 124. The anode 141 may be separately disposed in each sub-pixel SP. Also, the anode 141 is formed in the emissive area EA in each sub-pixel SP. Even if the anode 141 is made of a transparent conductive material, when the anode 141 overlaps with the transmissive area TA, the transmissivity of the transmissive area TA may be degraded. Therefore, the anode 141 may be formed only in the emissive area EA and may not be formed in the transmissive area TA, but is not limited thereto.

The cathode 143 is disposed on the anode 141. The cathode 143 serves to supply electrons into the white organic emission layer 142. For example, the cathode 143 may be made of a transparent conductive material such as indium tin oxide (ITO), indium zinc oxide (IZO), indium tin zinc oxide (ITZO), zinc oxide (ZnO) and tin oxide (TO) or an ytterbium (Yb) alloy, but is not limited thereto. As another example, the cathode 143 may be made of a metal material including calcium (Ca), barium (Ba), aluminum (Al), silver (Ag) or the like. If the cathode 143 is made of a metal material, it may be formed to have a very small thickness and thus may be substantially transparent. Also, the cathode 143 is not patterned and may be formed as a single layer on the anode 141. That is, the cathode 143 is not separately disposed in each of the plurality of sub-pixels SP and may be formed as a single layer.

The white organic emission layer 142 is disposed between the anode 141 and the cathode 143. The white organic emission layer 142 is configured to emit white light. The white organic emission layer 142 may be configured as a single emission layer to emit white light. Alternatively, the white organic emission layer 142 may have a stack structure in which a plurality of emission layers which emits light of different colors is laminated with a charge generation layer therebetween and emits white light. For example, the color of light emitted from a first emission layer may be complementary to the color of light emitted from a second emission layer. Thus, light emitted from the first emission layer and light emitted from the second emission layer may be mixed to finally emit white light. The white OLED 140 may further include at least one organic layer selected from a hole transport layer, an electron transport layer, a hole blocking layer, an electron blocking layer, a hole injection layer and an electron injection layer in addition to the white organic emission layer 142. Such an organic layer enables electrons or holes to be easily transferred or injected into the white organic emission layer 142 and adjusts a charge balance between electrons and holes. Thus, it is possible to further improve the emission efficiency of the white organic emission layer 142.

The white organic emission layer 142 is not separately disposed in each sub-pixel and may be a common layer formed in the plurality of sub-pixels SP. That is, as shown in FIG. 2, the white organic emission layer 142 may be formed as a single layer on the planarization layer 134 and the anode 141. The white organic emission layer 142 serving as a common layer in the plurality of sub-pixels SP may be formed using an open mask. If the white organic emission layer 142 is formed using an open mask, it is possible to solve the problems, such as color mixing caused by overlap or misalignment of a mask, which may occur when a pattern is deposited using a fine metal mask. Therefore, the white organic emission layer 142 has excellent color coordinates, etc.

A bank layer 135 is formed on the anode 141 and the planarization layer 134. The bank layer 135 serves to divide adjacent sub-pixels SP, and additionally serves to divide the emissive area EA and the transmissive area TA in one sub-pixel SP. Therefore, the bank layer 135 is disposed between adjacent sub-pixels SP and between the emissive area EA and the transmissive area TA in one sub-pixel SP. Also, the bank layer 135 may be formed to open a portion of the anode 141. The bank layer 135 may be made of an organic insulating material. For example, the bank layer 135 may be made of one or more materials selected from polyimide, photo acryl, and benzocyclobutene (BCB). The bank layer 135 may be formed in a tapered shape.

Meanwhile, FIG. 2 illustrates that the white organic emission layer 142 and the cathode 143 constituting the white OLED 140 are formed on the entire surface of the bank layer 135 and the planarization layer 134. Although not illustrated in the drawings, the white organic emission layer and the cathode may be separately formed only in the emissive area EA of each sub-pixel SP.

The encapsulation layer 150 is disposed on the white OLED 140. The encapsulation layer 150 suppresses deterioration of the white OLED 140 caused by permeation of impurities such as water from the outside, and flattens an upper portion of the white OLED 140. The encapsulation layer 150 may be made of an inorganic insulating material. FIG. 2 illustrates the encapsulation layer 150 as a single layer, but the encapsulation layer 150 may be formed to have a multilayered structure as necessary. For example, the encapsulation layer may include a first inorganic encapsulation layer, an organic encapsulation layer and a second inorganic encapsulation layer.

For example, the first inorganic encapsulation layer and the second inorganic encapsulation layer may be independently made of one or more materials selected from silicon nitride (SiNx), silicon oxide (SiOx), silicon oxynitride (SiON) or aluminum oxide ($Al_2O_3$), but are not limited thereto.

For example, the organic encapsulation layer may be made of one or more materials selected from poly imide, polystyrene resin, acryl resin, epoxy resin, urea resin, isocyanate resin, xylene resin and silicon oxycarbon (SiOC), but is not limited thereto.

The filling part 160 is formed on the encapsulation layer 150. The filling part fills a space between the encapsulation layer 150 and the second substrate 170.

When the first substrate 110 is bonded to the second substrate 170, if a space between the first substrate 110 and the second substrate 170 is not filled with a separate material, the organic light emitting display device 100 may be relatively vulnerable to permeation of water and oxygen from the outside. Accordingly, the filling part 160 is formed in the space between the first substrate 110 and the second substrate 170 to suppress permeation of water and oxygen.

For example, the filling part 160 includes a base resin and a getter.

The base resin is a resin composition made of a binder compound and serves to disperse the getter. The base resin itself may block water. Also, the base resin may be a transparent adhesive resin that may bond the encapsulation layer 150 to the second substrate 170. The getter may more effectively suppress permeation of water or oxygen from the outside of the organic light emitting display device 100 by absorbing water or blocking the permeation and progress path of water and oxygen. The base resin and the getter constituting the filling part 160 will be described in detail below.

The second substrate 170 is disposed on the filling part 160. The second substrate 170 is disposed to face the first substrate 110. The second substrate 170 serves to support various components of the organic light emitting display device 100. A color filter is formed on the second substrate 170. The second substrate 170 may be a color filter substrate on which a color filter layer 171 for implementing a color of the organic light emitting display device 100 and a black matrix 172 are formed.

The black matrix 172 is formed on a lower surface of the second substrate 170. The black matrix 172 is formed at a boundary between sub-pixels SP and at a boundary between the emissive area EA and the transmissive area TA in a sub-pixel SP. The black matrix 172 serves to divide emission areas of light passing through the color filter layer 171 so that light passing through each color filter does not overlap or mix with each other. For example, the black matrix 172 may be formed as an opaque metal film such as chromium (Cr), or may be formed containing a black pigment or pigments in different colors and a resin.

The color filter layer 171 is formed on the lower surface of the second substrate 170. The color filter layer 171 may be formed on the second substrate 170 for each sub-pixel SP. Specifically, the color filter layer 171 may include a red color filter, a green color filter and a blue color filter patterned corresponding to colors of the plurality of sub-pixels SP, respectively. According to an embodiment of the present disclosure, white light is emitted from the white OLED 140, and, thus, a color image may be represented by the color filter layer 171 patterned for each sub-pixel SP.

The dam structure 180 is formed between the first substrate 110 and the second substrate 170 in the non-display area NDA. The dam structure 180 is disposed to surround the filling part 160. The dam structure 180 is disposed to be in contact with each of the first substrate 110 and the second substrate 170. The dam structure 180 bonds the first substrate 110 to the second substrate 170 to enhance the adhesive strength of the filling part 160. The dam structure 180 may block permeation of water and oxygen through a side surface of the organic light emitting display device 100. The dam structure 180 serves as a member for sealing components between the first substrate 110 and the second substrate 170 and thus may be referred to as a sealant.

Figure 3:
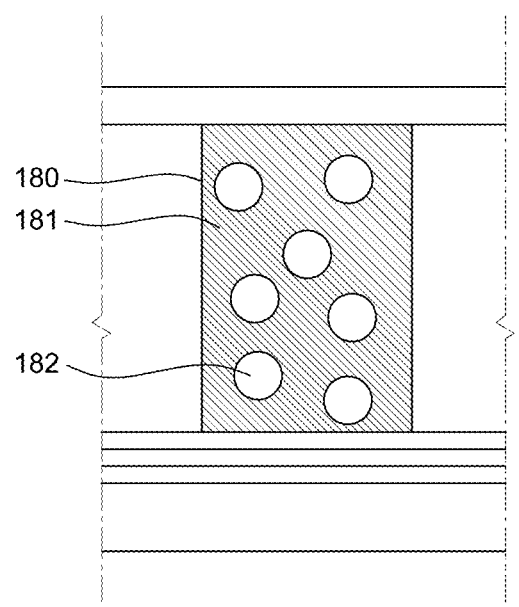
FIG. 3 is a schematic diagram provided to explain the configuration of a dam structure of the organic light emitting display device according to an exemplary embodiment of the present disclosure.

FIG. 3 is a schematic diagram provided to explain the configuration of a dam structure of the organic light emitting display device according to an exemplary embodiment of the present disclosure.

Referring to FIG. 3, the dam structure 180 includes a base resin 181 and a getter 182.

The getter 182 may be a surface-modified magnesium oxide particle.

Porous silica or a metal-organic framework conventionally used as a getter is physically bound to water, and the physically absorbed water may be easily desorbed depending on an external environment. Meanwhile, a magnesium oxide particle chemically interacts with water, and the water is not easily desorbed. Therefore, the magnesium oxide particle may have excellent water absorption property and may maintain high resistance to water permeation for a relatively long time. Also, calcium oxide conventionally used as a getter is a colored particle and thus decreases the transparency. If the calcium oxide absorbs an excessive amount of water, it may be easily degraded. Meanwhile, the magnesium oxide particle has excellent water absorption property but decreases the transparency. Accordingly, to improve the transmittance while maintaining high water absorption property, a nano-sized magnesium oxide particle is used. However, it is difficult to uniformly disperse such nano-sized particles in the base resin due to aggregation of particles. If aggregation of particles occurs, the size of the getter dispersed in the base resin increases from nano to micro scale, which results in an increase in a haze value. Accordingly, there is a limitation in improvement of transmittance.

According to the present disclosure, the surface-modified magnesium oxide particle is used as the getter 182. Thus, the transparency is greatly improved and the water absorption property is improved.

First, magnesium oxide particles may have an average diameter of from 10 nm to 300 nm or from 10 nm to 100 nm. If the average diameter of the magnesium oxide particles is within the above-described range, the transparency may be improved and the amount of water absorption may be increased.

The surface of the magnesium oxide particle is modified into a first surface modification part and a second surface modification part.

The first surface modification part is formed by modifying the surface of the magnesium oxide particle with an amino silane-based compound. That is, the first surface modification part is made of an amino silane-based compound. For example, the amino silane-based compound may include at least one selected from 3-(trimethoxysilylpropyl)diethylenetriamine, (3-aminopropyl)trimethoxysilane, 1-(3-(trimethoxysilyl)propyl) urea, (3-aminopropyl)triethoxysilane, 3-aminopropyl-methyl-diethoxysilane, N-3-(trimethoxysilyl)propyl ethylenediamine and N-(3-(dimethoxymethylsilyl)propyl ethylenediamine).

Specifically, the magnesium oxide particle is added to a mixed solution of alcohol and distilled water with addition of acid to form a hydroxyl group on the surface of the magnesium oxide particle. If an amino silane-based compound is added thereto, the hydroxyl group reacts with the amino silane-based compound. Thus, the surface of the magnesium oxide particle is modified with the amino silane-based compound.

For example, 3-(trimethoxysilylpropyl)diethylenetriamine is used as the amino silane-based compound. When the surface of the magnesium oxide particle is modified using the compound, a product represented by the following General Formula 1 may be obtained.

[General Formula 1]

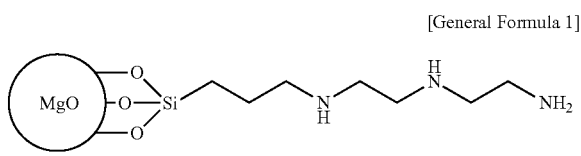

The amino silane-based compound has an alkoxysilyl group and an amine group in a molecule. As shown in General Formula 1, the alkoxysilyl group reacts with the hydroxyl group on the surface of the magnesium oxide particle to form a bond. Thus, the amine group is introduced to the surface of the magnesium oxide particle modified with the amino silane-based compound. Specifically, a primary amine group (—NH$_2$) is introduced to the surface of the magnesium oxide particle modified with the amino silane-based compound.

The amine group may form a hydrogen bond with water and thus suppress the advance of water. Therefore, it is possible to provide higher resistance to water permeation due to the effect of suppressing the advance of water by the first surface modification part in addition to the waterproofing properties of the magnesium oxide.

Referring to General Formula 1, if 3-(trimethoxysilylpropyl)diethylenetriamine is used as the amino silane-based compound, the surface-modified magnesium oxide has a primary amine group at the end of the first surface modification part. Also, the surface-modified magnesium oxide has two secondary amine groups (—NH—) in the middle of the first surface modification part. Accordingly, it is possible to further suppress the advance of water and thus possible to provide high resistance to water permeation.

The second surface modification part is bound to the first surface modification part. The second surface modification part may be made of a compound containing an acrylate group and a methacrylate group. For example, the compound containing the acrylate group and the methacrylate group may be 3-(acryloyloxy)-2-hydroxypropyl methacrylate represented by the following Chemical Formula 1.

[Chemical Formula 1]

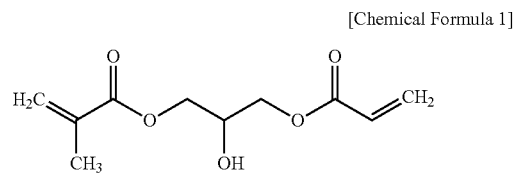

As shown in Chemical Formula 1, 3-(acryloyloxy)-2-hydroxypropyl methacrylate has an acrylate group at one end and a methacrylate group at the other end.

As described above, the magnesium oxide particle is surface-treated with the amino silane-based compound, and, thus, an amine group is introduced to the surface of the magnesium oxide particle. The amine group may make a Michael addition reaction with the acrylate group, but cannot make a Michael addition reaction with the methacrylate group. Therefore, the second surface modification part may be bound to the first surface modification part through a Michael addition reaction between the amine group of the first surface modification part and the acrylate group.

If a Michael addition reaction is made between 3-(acryloyloxy)-2-hydroxypropyl methacrylate and the magnesium oxide particle whose surface is modified into the first surface modification part and which is represented by General Formula 1, a magnesium oxide particle whose surface is modified into the first surface modification part and the second surface modification part and which is represented by the following General Formula 2 may be obtained.

[General Formula 2]

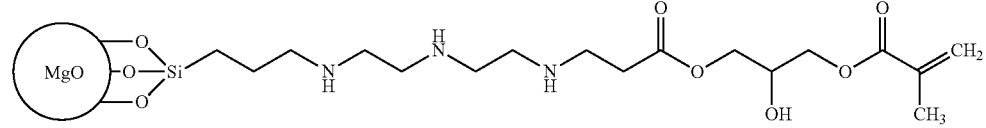

For the convenience of description, General Formula 2 shows that a bond is formed through a Michael addition reaction between the amine group at the end of the first surface modification part and 3-(acryloyloxy)-2-hydroxypropyl methacrylate. However, an amine group in the middle of a chain of the first surface modification part may also make a Michael addition reaction. That is, if 3-(trimethoxysilylpropyl)diethylenetriamine is used as a surface modifier to form the first surface modification part, each of a plurality of amine groups included in a molecule may make a Michael addition reaction with 3-(acryloyloxy)-2-hydroxypropyl methacrylate.

Specifically, referring to General Formula 1 again, each of the primary amine group (—NH$_2$) at the end of the first surface modification part and the secondary amine group (—NH—) in the middle of the first surface modification part introduced through surface modification with 3-(trimethoxysilylpropyl) diethylenetriamine makes a Michael addition reaction with the acrylate group of 3-(acryloyloxy)-2-hydroxypropyl methacrylate. Therefore, a surface-modified magnesium oxide particle represented by the following General Formula 3 may be obtained.

[General Formula 3]

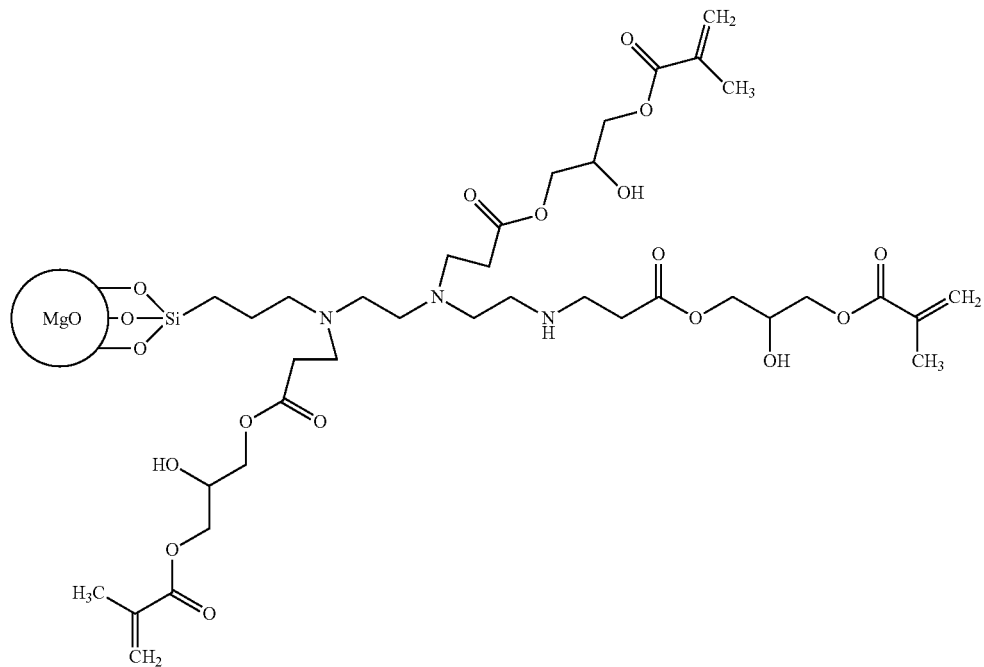

As shown in General Formula 3, if a surface modification part in the form of a basin is formed in the surface of the magnesium oxide particle, it is possible to suppress the advance of water introduced from the outside or water desorbed from the magnesium oxide particle. Thus, it is possible to further improve resistance to water permeation.

Also, referring to General Formula 3, the secondary amine group (—NH—) formed from the Michael addition reaction between the primary amine group (—NH$_2$) and 3-(acryloyloxy)-2-hydroxypropyl methacrylate may also make a Michael addition reaction with 3-(acryloyloxy)-2-hydroxypropyl methacrylate. The resultant product may be represented by the following General Formula 3'.

[General Formula 3']

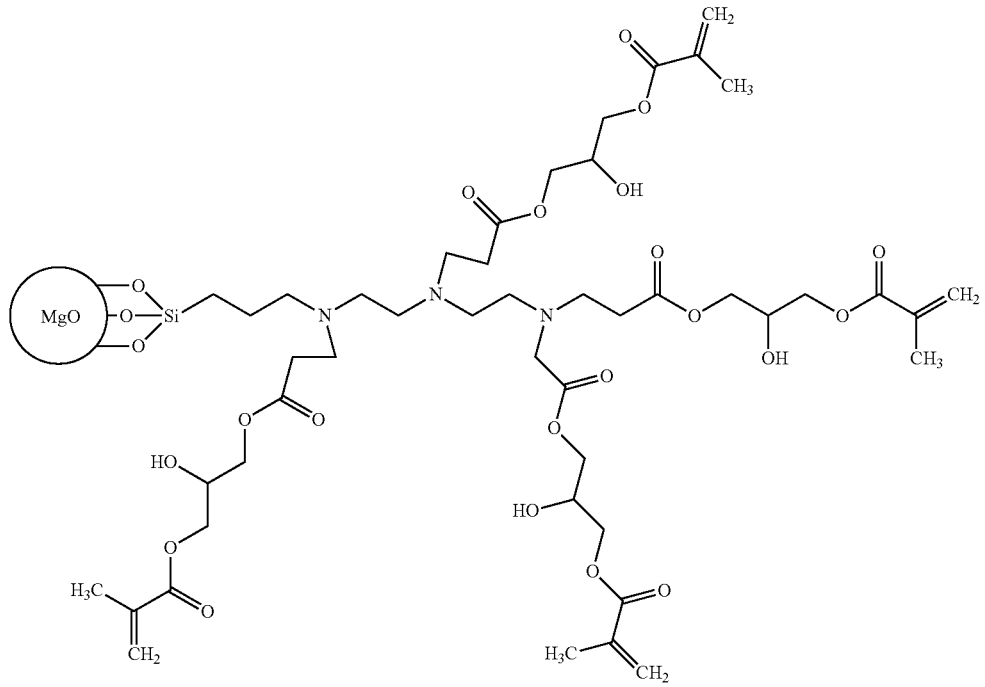

As shown in General Formulas 2 and 3, a methacrylate group is introduced to the surface of the magnesium oxide particle whose surface is modified into the second surface modification part.

The base resin 181 is a resin composition made of a binder compound and serves to disperse the getter 182. The base resin 181 itself may block water. Preferably, the base resin 181 may have high transparency to secure optical properties of the organic light emitting display device 100. Also, the dam structure 180 bonds the first substrate 110 to the second substrate 170. Therefore, the base resin may be a transparent adhesive resin.

The base resin 181 may be formed by polymerization of a binder compound. For example, a binder compound constituting the base resin may be an acryl-based monomer or oligomer containing at least two (met)acrylate groups. The acryl-based monomer or oligomer is cured to form acrylic-based resin. For example, the binder compound may be bisphenol A glycerolate di(meth)acrylate. Such a binder compound is preferable because it is transparent and contains a hydroxyl group that gives intramolecular adhesion. However, the present disclosure is not limited thereto. Any material known in the art as a (met)acrylate-based monomer and/or oligomer that is transparent and has adhesive properties may be used.

The (met)acrylate groups of the binder compound may be chemically bound to the methacrylate group of the second surface modification part. Therefore, when the base resin 181 is formed, the base resin 181 and the getter 182 may be chemically bound to each other through a reaction between the methacrylate group of the second surface modification part of the surface-modified getter 182 and the (met)acrylate group of the binder compound. As such, the base resin 181 is chemically bound to the getter 182, and, thus, it is possible to maintain high resistance to water permeation of the dam structure 180 and greatly improve optical properties.

Conventionally, if the amount of a getter dispersed in a base resin is increased, the water absorption property is improved but the transmittance is degraded. Also, if a nano-sized getter is used, it is difficult to uniformly disperse the getter in the base resin due to aggregation of particles and the size of the getter increases from nano to micro scale. Therefore, a haze value is increased. Accordingly, there is a limitation in improvement of transmittance. Further, the nano-sized getter has a large surface area, and, thus, particles of the getter may be degraded due to fast water absorption. Accordingly, resistance to water permeation lasts for a short time.

According to the present disclosure, the magnesium oxide particle whose surface is modified into the first surface modification part and the second surface modification part is used as the getter 182. Here, the first surface modification part and the second surface modification part respectively made of different compounds are chemically bound to each other. That is, the surface of the magnesium oxide particle is modified into a surface modification part formed into a long chain so that hydrophobic properties of the getter 182 may be increased. Accordingly, the compatibility between the getter 182 and the base resin 181 may be greatly increased. In addition, when the base resin 181 is formed, the base resin 181 and the getter 182 are chemically bound to each other through a reaction between the methacrylate group of the second surface modification part and the (met)acrylate group of the binder compound. Accordingly, even when the amount of the getter 182 is increased, the transmittance of the dam structure 180 is not greatly degraded and the water absorption property may be further improved.

For example, the getter 182 may be contained at a ratio of from 0.5 wt % to 20 wt %, from 1 wt % to 10 wt % or from 3 wt % to 7 wt % based on a total weight of the base resin 181 and the getter 182. In this range, the dam structure 180 has a high light transmittance and a low haze value and thus has excellent transparency and excellent resistance to water permeation. If the getter 182 is contained at less than 0.5 wt %, the water absorption property is too low, and, thus, the waterproofing properties of the dam structure 180 may be degraded. If the getter 182 is contained at more than 20 wt %, the haze value is increased, and, thus, the transmittance may be degraded.

Also, the first surface modification part has at least one amine group and the second surface modification part has a hydroxyl group. These functional groups may interact with water. That is, these functional groups may be bound to water introduced form the outside or water desorbed from the magnesium oxide particle, which suppresses or delays the advance of water toward the OLED 140.

Accordingly, the transparency of the entire organic light emitting display device may increase, and, thus, the optical properties may be improved. Also, the resistance to water permeation may increase, and, thus, the display quality and durability may be improved.

The dam structure 180 may further contain an additive within a range not to degrade the optical properties or reduce the adhesive strength. The additive may serve to compensate for the shape and performance of the dam structure 180. For example, a spacer and/or a filler may be used as the additive.

The spacer maintains a height of the dam structure 180 to maintain a gap between the first substrate 110 and the second substrate 170. Also, the spacer blocks a permeation path of water introduced from the outside.

The spacer may be made of an elastic material. Therefore, it is possible to easily adjust a gap between the first substrate 110 and the second substrate 170. Also, the elastic spacer may bond the first substrate 110 to the second substrate 170 more stably. More specifically, when the first substrate 110 is bonded to the second substrate 170, they are elastically deformed and stably bonded to each other by applying a predetermined stress thereto. When the stress is reduced or eliminated, the elastic deformation is recovered, and, thus, the gap between the substrates may be more uniformly maintained.

The filler may serve to increase a moving path of water permeating through a side surface of the organic light emitting display device 100 to suppress permeation of water. Also, the filler may have waterproofing properties. Therefore, the resistance to water permeation of the dam structure may be further improved. For example, the filler may be at last one selected from clay, talc, silica, barium sulfate, aluminum hydroxide, calcium carbonate, magnesium carbonate, zeolite, zirconia, titania, montmorillonite, alumina, aluminum nitride, cerium oxide, hafnium oxide, niobium pentoxide, tantalum pentoxide, indium oxide, tin oxide, indium tin oxide, zinc oxide, zinc sulfide, calcium carbonate and silicon nitride, but is not limited thereto.

The filler may be a lamellar filler. The lamellar filler has a greater aspect ratio than a spherical filler and thus makes a moving path of water long and complicated. Therefore, the lamellar filler may further improve the resistance to water permeation of the dam structure 180. However, the present disclosure is not limited thereto. Various fillers such as a spherical filler, an oval filler and an amorphous filler may be used.

The filler may be surface-treated with a silane coupling agent so as to be easily dispersed in the base resin 181.

As described above, the filling part 160 of the present disclosure includes a base resin and a getter. The base resin and the getter constituting the filling part 160 may be identical to the base resin 181 and the getter 182 constituting the dam structure 180. In this case, the resistance to water permeation and the transmittance of the organic light emitting display device 100 may be further improved. Thus, it is possible to provide a display device having excellent reliability and durability with superior optical properties.

Also, the filling part 160 may further include a filler, and the filler may be identical to the filler included in the dam structure 180.

In an exemplary embodiment of the present disclosure, it has been described that the magnesium oxide particle modified into the first surface modification part and the second surface modification part is used as a getter in each of the dam structure 180 and the filling part 160. However, the present disclosure is not limited thereto. The magnesium oxide particle modified into the first surface modification part and the second surface modification part may be applied to only any one of the dam structure and the filling part.

Hereinafter, the effects of the present disclosure will be described in more detail with reference to the following Embodiments. However, the following Embodiments are merely provided to show examples of the present disclosure, and do not limit the scope of the present disclosure.

Preparation Embodiment 1

0.51 g of magnesium nitrate hexahydrate ($Mg(NO_3)_2$ $6H_2O$) was put into 10 ml of distilled water and stirred to prepare a precursor solution. After 0.84 g of polyethylene glycol and 0.25 g of sodium hydroxide were dissolved in 20 ml of distilled water, the resultant product was added into the precursor solution followed by stirring at room temperature for 1 hour to synthesize magnesium oxide nanoparticles. The product was centrifuged to separate a precipitate. Then, the separated precipitate was put into ethanol followed by centrifugation and purification. Thereafter, the purified product was dried at 60° C. for 5 hours and then calcined at 400° C. for 1 hour, thereby obtaining magnesium oxide nanoparticle powder.

Preparation Embodiment 2

1. First Surface Modification

A solvent whose pH was adjusted to 4 by adding 0.02 ml of hydrochloric acid into 10 ml of a mixed solution of ethanol and distilled water was prepared. Then, 0.2 g of the magnesium oxide nanoparticle powder of Preparation Embodiment 1 and 2 g of 3-(trimethoxysilylpropyl)diethylenetriamine (TPDT), which is a first surface modifier, were added into the solvent and reacted in a silicone oil tank of 80° C. in boiling water with stirring for 6 hours.

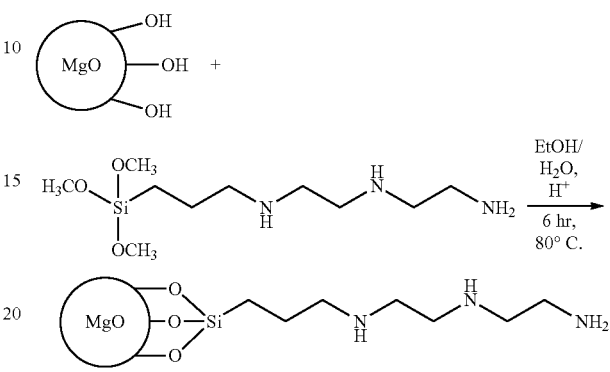

2. Second Surface Modification

Then, 16 g of 3-(acryloyloxy)-2-hydroxypropylmethacrylate (AHM), which is a first surface modifier, was added into a reaction bath and reacted for 12 hours with continuous stirring. Thereafter, the product was centrifuged to separate a precipitate. Then, the precipitate was put into ethanol followed by centrifugation and purification. Then, the product was dried at 50° C. for 3 hours, thereby obtaining magnesium oxide particles whose surfaces were modified with TPDT and AHM.

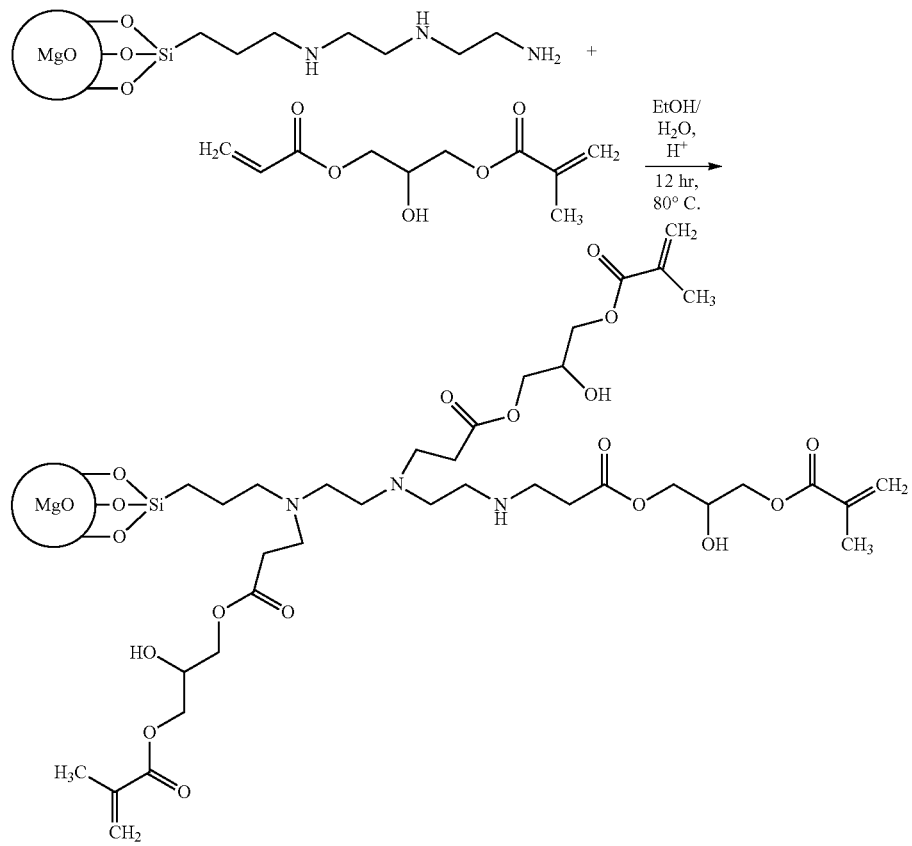

Preparation Embodiment 3

A solvent whose pH was adjusted to 4 by adding 0.02 ml of hydrochloric acid into 10 ml of a mixed solution of ethanol and distilled water was prepared. Then, 0.2 g of the magnesium oxide nanoparticle powder same as Embodiment 1 and 4 g of 3-methacryloxypropyl trimethoxysilane (MPS), which is a surface modifier, were added into the solvent and reacted in a silicone oil tank of 80° C. in boiling water for 12 hours. The product was centrifuged to separate a precipitate. Then, the precipitate was put into ethanol followed by centrifugation and purification. Thereafter, the product was dried at 50° C. for 3 hours, thereby obtaining magnesium oxide particles whose surfaces were modified with MPS.

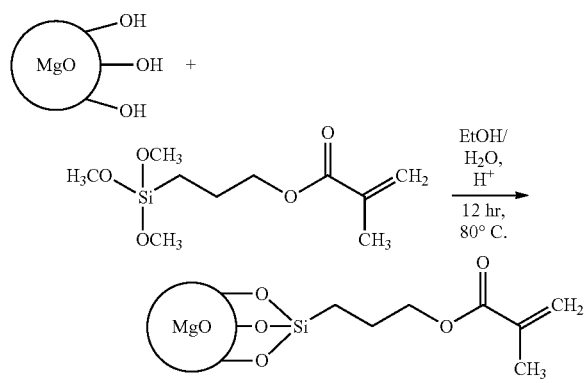

Experimental Embodiment 1

Figure 4A:
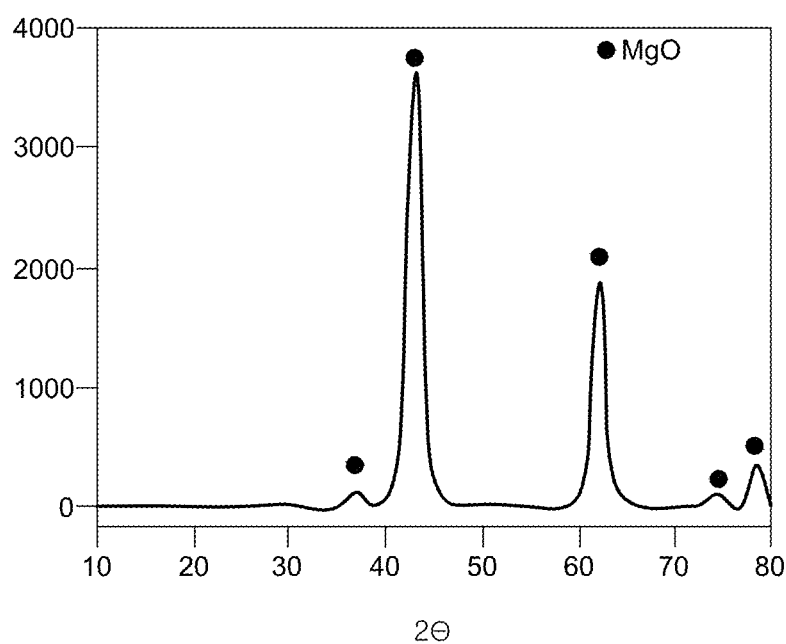
FIG. 4A is an X-ray diffraction spectrum of a magnesium oxide nanoparticle according to Preparation Embodiment 1.
Figure 4B:
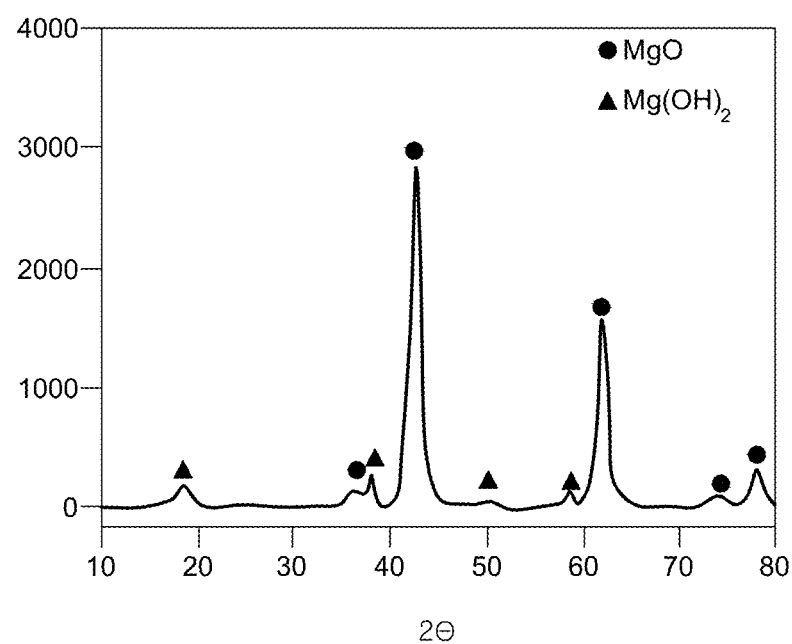
FIG. 4B is an X-ray diffraction spectrum of a surface-modified magnesium oxide nanoparticle according to Preparation Embodiment 2.
Figure 4C:
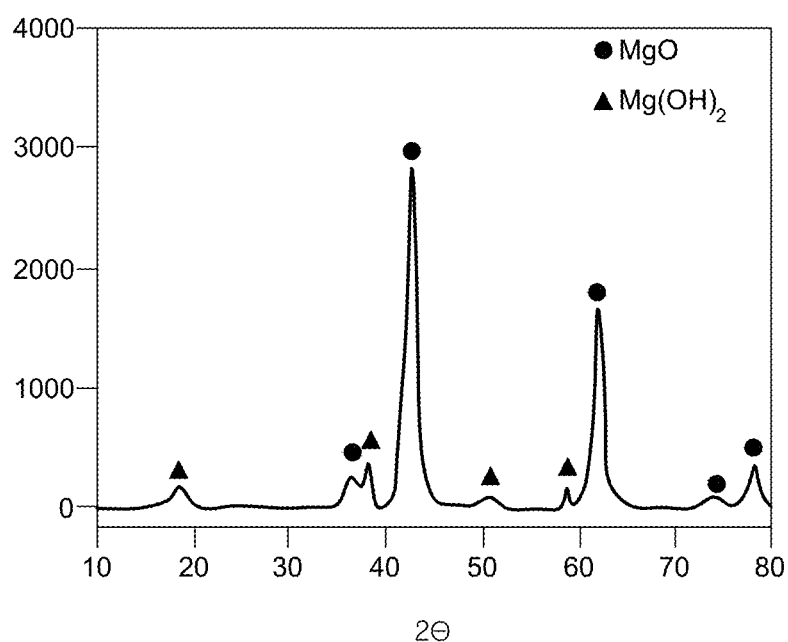
FIG. 4C is an X-ray diffraction spectrum of a surface-modified magnesium oxide nanoparticle according to Preparation Embodiment 3.

The crystallinity and absorption of the magnesium oxide nanoparticles of Preparation Embodiment 1 and the surface-modified magnesium oxide nanoparticles of Preparation Embodiment 2 and Preparation Embodiment 3 were measured. The crystallinity was measured using an X-ray diffraction analyzer, and the measurement results were as shown in FIG. 4A through FIG. 4C. Also, the absorption was measured using a dynamic vapor sorption equipment by analyzing changes in weight of the samples while the relative humidity at 25° C. was increased from 0% to 90% to reach saturation. The measurement results were as shown in FIG. 5A through FIG. 5C.

First, FIG. 4A is an X-ray diffraction spectrum of a magnesium oxide nanoparticle according to Preparation Embodiment 1. FIG. 4B is an X-ray diffraction spectrum of a surface-modified magnesium oxide nanoparticle according to Preparation Embodiment 2. FIG. 4C is an X-ray diffraction spectrum of a surface-modified magnesium oxide nanoparticle according to Preparation Embodiment 3.

Referring to FIG. 4A through FIG. 4C, it may be seen that as for the magnesium oxide particles of Preparation Embodiment 1, only a magnesium oxide (MgO) peak is observed, but as for the surface-modified magnesium oxide particles of Preparation Embodiment 2 and Preparation Embodiment 3, a weak $Mg(OH)_2$ peak is observed. Accordingly, it may be seen that the magnesium oxide particles of Preparation Embodiment 2 and Preparation Embodiment 3 are surface-modified particles.

Figure 5A:
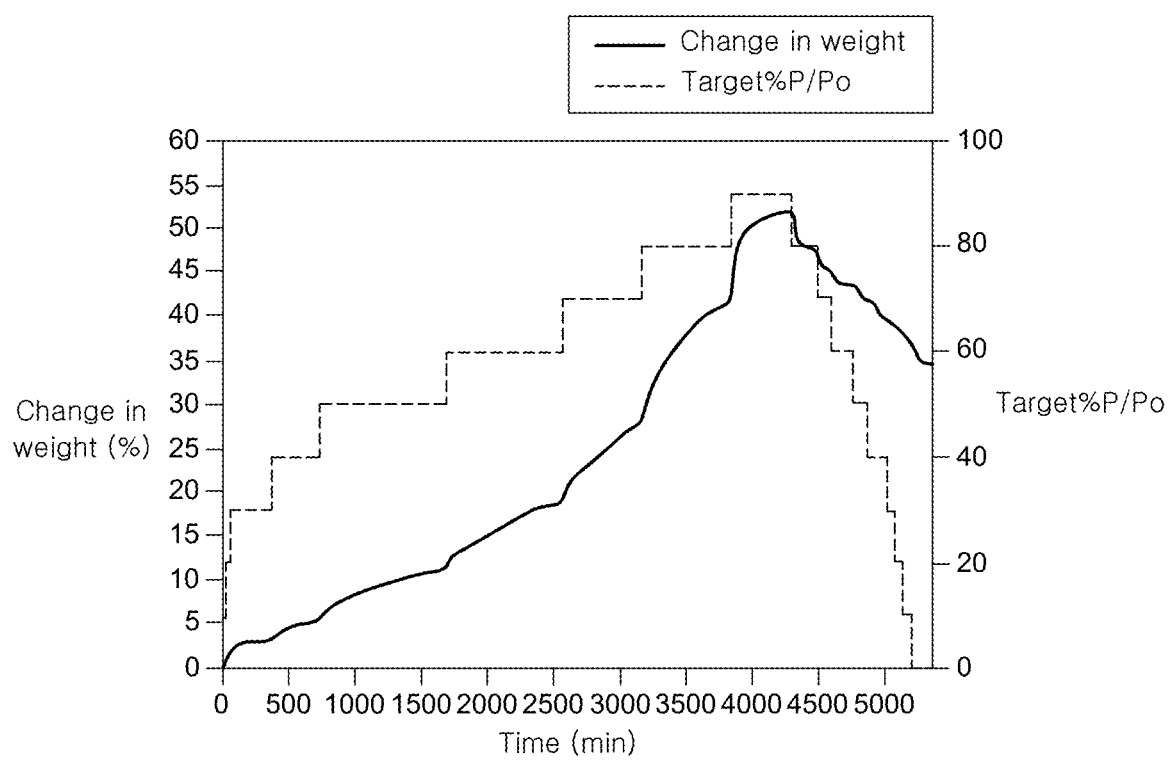
FIG. 5A is a graph showing a change in weight of a magnesium oxide nanoparticle according to Preparation Embodiment 1 depending on a change in relative humidity.
Figure 5B:
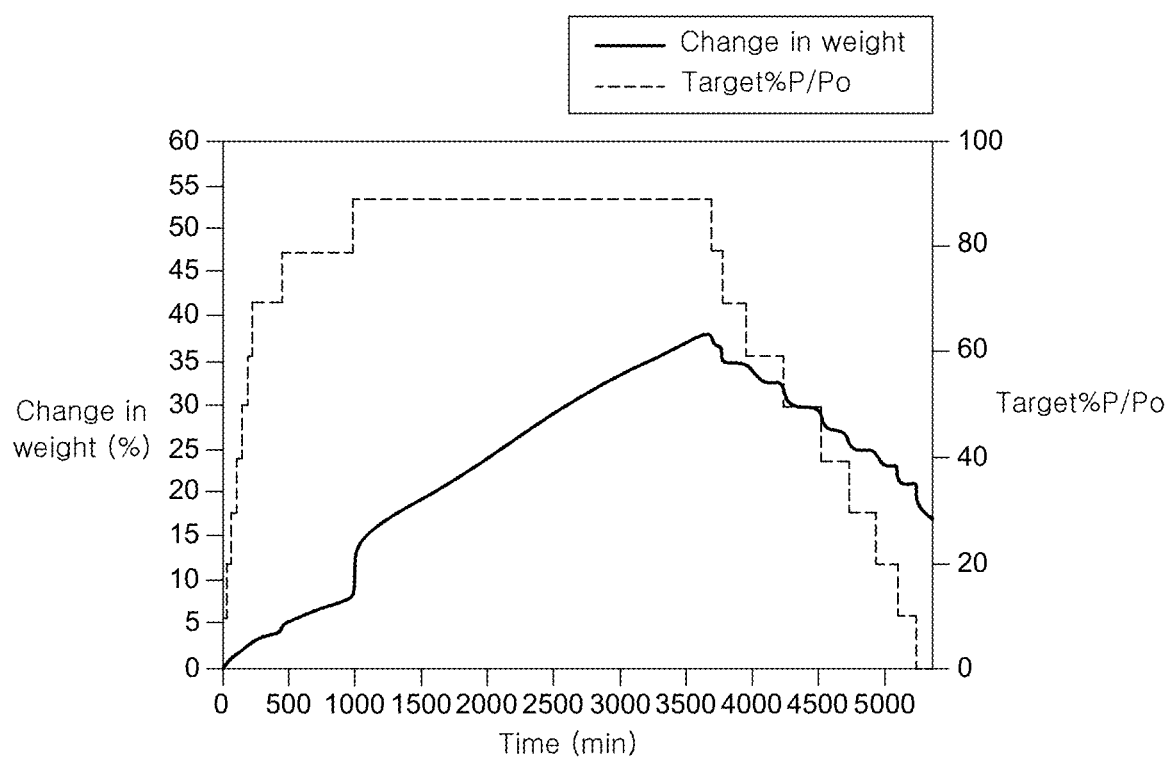
FIG. 5B is a graph showing a change in weight of a surface-modified magnesium oxide nanoparticle according to Preparation Embodiment 2 depending on a change in relative humidity.
Figure 5C:
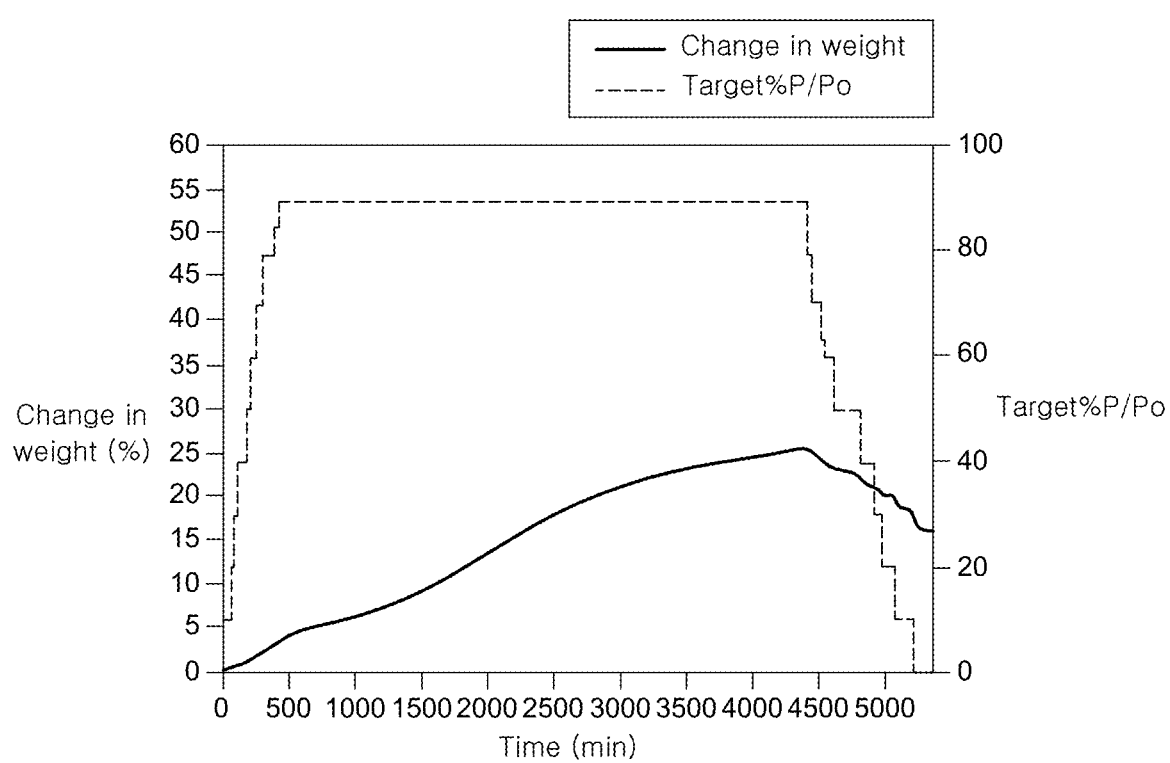
FIG. 5C is a graph showing a change in weight of a surface-modified magnesium oxide nanoparticle according to Preparation Embodiment 3 depending on a change in relative humidity.

FIG. 5A through FIG. 5C are graphs showing a change in weight of Preparation Embodiments 1 to 3, respectively, depending on a change in relative humidity.

Referring to FIG. 5A through FIG. 5C, it may be seen that the surface-modified magnesium oxide particles of Preparation Embodiment 2 and Preparation Embodiment 3 show similar absorption behaviors. However, it may be seen that the surface-modified magnesium oxide particles of Preparation Embodiment 2 whose surfaces were modified with TPDT and AHM and in which surface modification parts have a long chain show a higher maximum amount of water absorption than the surface-modified magnesium oxide particles of Preparation Embodiment 3 whose surfaces were modified with MPS.

Embodiment 1A

A dam-forming composition was prepared using the surface-modified magnesium oxide nanoparticles of Preparation Embodiment 2 as a getter. Specifically, 0.01 g of the surface-modified magnesium oxide nanoparticles of Preparation Embodiment was dispersed in 0.99 g of a binder resin (bisphenol A glycerolate dimethacrylate oligomer) containing 1 wt % of a photoinitiator to prepare a dam-forming composition (1 wt % of the getter).

Embodiment 1B

A dam-forming composition was prepared in the same manner as in Embodiment 1A except that the amounts of the surface-modified magnesium oxide nanoparticles of Preparation Embodiment 2 and the binder resin were changed to 0.02 g and 0.98 g, respectively.

Embodiment 1C

A dam-forming composition was prepared in the same manner as in Embodiment 1A except that the amounts of the surface-modified magnesium oxide nanoparticles of Preparation Embodiment 2 and the binder resin were changed to 0.03 g and 0.97 g, respectively.

Embodiment 1D

A dam-forming composition was prepared in the same manner as in Embodiment 1A except that the amounts of the surface-modified magnesium oxide nanoparticles of Preparation Embodiment 2 and the binder resin were changed to 0.05 g and 0.95 g, respectively.

Comparative Embodiment 1A

A dam-forming composition was prepared in the same manner as in Embodiment 1a except that the surface-unmodified magnesium oxide nanoparticles of Preparation Embodiment 1 were used instead of the surface-modified magnesium oxide nanoparticles of Preparation Embodiment 2.

Comparative Embodiment 1B

A dam-forming composition was prepared in the same manner as in Embodiment 1B except that the surface-unmodified magnesium oxide nanoparticles of Preparation Embodiment 1 were used instead of the surface-modified magnesium oxide nanoparticles of Preparation Embodiment 2.

Comparative Embodiment 1C

A dam-forming composition was prepared in the same manner as in Embodiment 1C except that the surface-unmodified magnesium oxide nanoparticles of Preparation Embodiment 1 were used instead of the surface-modified magnesium oxide nanoparticles of Preparation Embodiment 2.

Comparative Embodiment 1D

A dam-forming composition was prepared in the same manner as in Embodiment 1D except that the surface-unmodified magnesium oxide nanoparticles of Preparation Embodiment 1 were used instead of the surface-modified magnesium oxide nanoparticles of Preparation Embodiment 2.

Comparative Embodiment 2A

A dam-forming composition was prepared in the same manner as in Embodiment 1A except that the surface-modified magnesium oxide nanoparticles of Preparation Embodiment 3 were used instead of the surface-modified magnesium oxide nanoparticles of Preparation Embodiment 2.

Comparative Embodiment 2B

A dam-forming composition was prepared in the same manner as in Embodiment 1B except that the surface-modified magnesium oxide nanoparticles of Preparation Embodiment 3 were used instead of the surface-modified magnesium oxide nanoparticles of Preparation Embodiment 2.

Comparative Embodiment 2C

A dam-forming composition was prepared in the same manner as in Embodiment 1C except that the surface-modified magnesium oxide nanoparticles of Preparation Embodiment 3 were used instead of the surface-modified magnesium oxide nanoparticles of Preparation Embodiment 2.

Comparative Embodiment 2D

A dam-forming composition was prepared in the same manner as in Embodiment 1D except that the surface-modified magnesium oxide nanoparticles of Preparation Embodiment 3 were used instead of the surface-modified magnesium oxide nanoparticles of Preparation Embodiment 2.

Comparative Embodiment 3

A dam-forming composition was prepared in the same manner as in Embodiment 1D except that surface-unmodified calcium oxide nanoparticles were used instead of the surface-modified magnesium oxide nanoparticles of Preparation Embodiment 2.

Experimental Embodiment 2

The transmittance and haze of dam structures made of the dam-forming compositions of Embodiments 1A through 1D, Comparative Embodiments 1A through 1D and Comparative Embodiments 2A through 2D were measured. To measure the transmittance and haze, a dam-forming composition was coated on a glass substrate by a bar coating method and then cured by irradiation with UV dose of 70 mJ/cm$^2$ from a UV lamp, thereby manufacturing a film type sample having a thickness of 10 μm. The transmittance and haze were measured at a wavelength of 550 nm using a UV-Vis spectrometer. The measurement results were as shown in Table 1 and FIG. 6A through FIG. 6D.

Figure 6A:
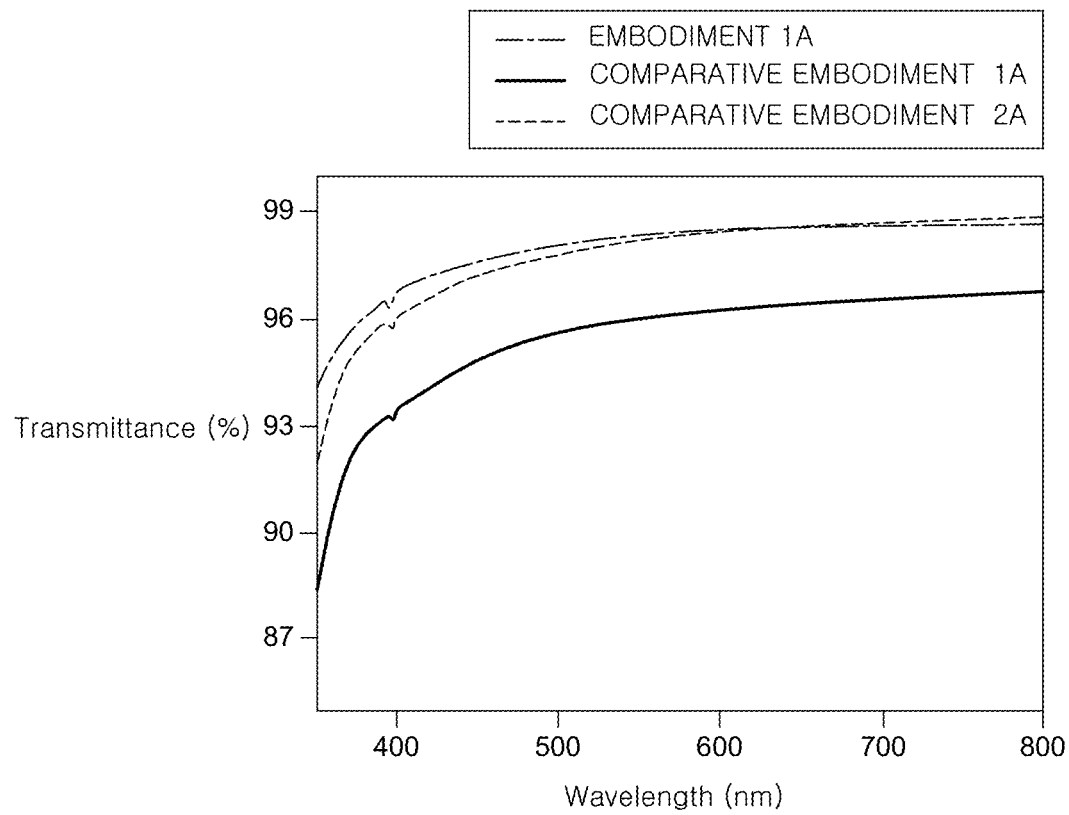
FIG. 6A is a graph showing transmittances of dam structures according to Embodiment 1A, Comparative Embodiment 1A and Comparative Embodiment 2A in a visible wavelength range.
Figure 6B:
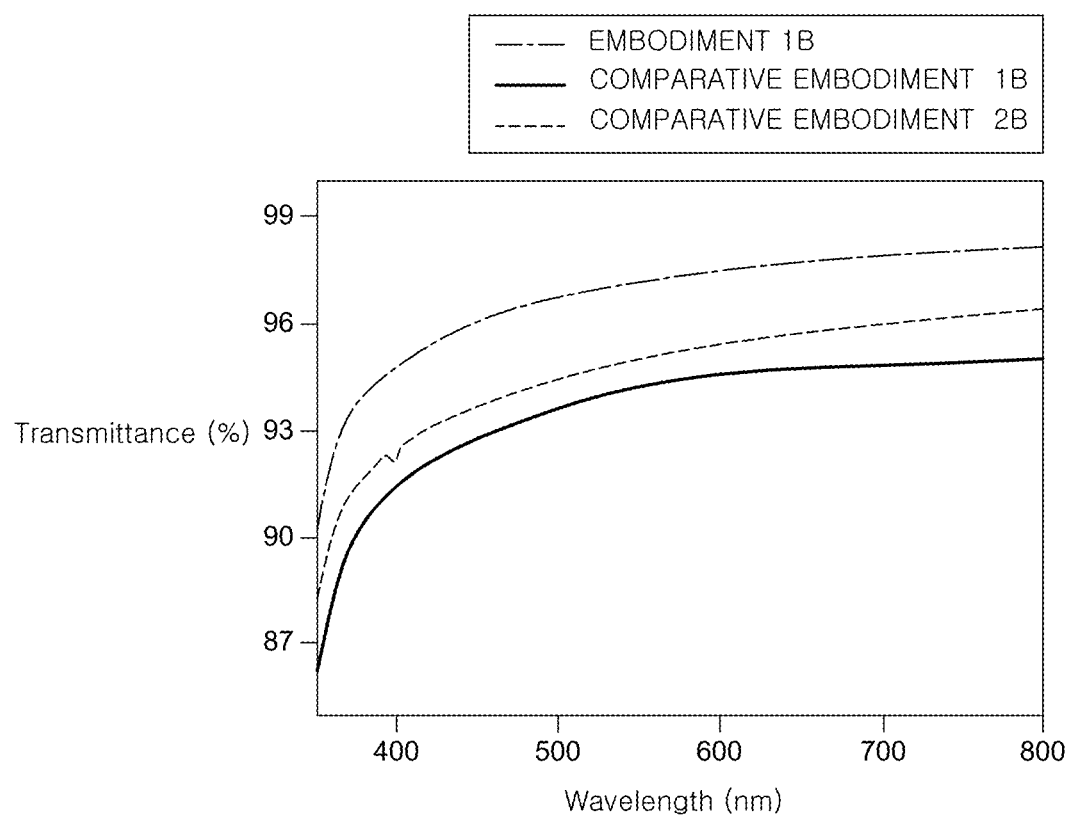
FIG. 6B is a graph showing transmittances of dam structures according to Embodiment 1B, Comparative Embodiment 1B and Comparative Embodiment 2B in a visible wavelength range.
Figure 6C:
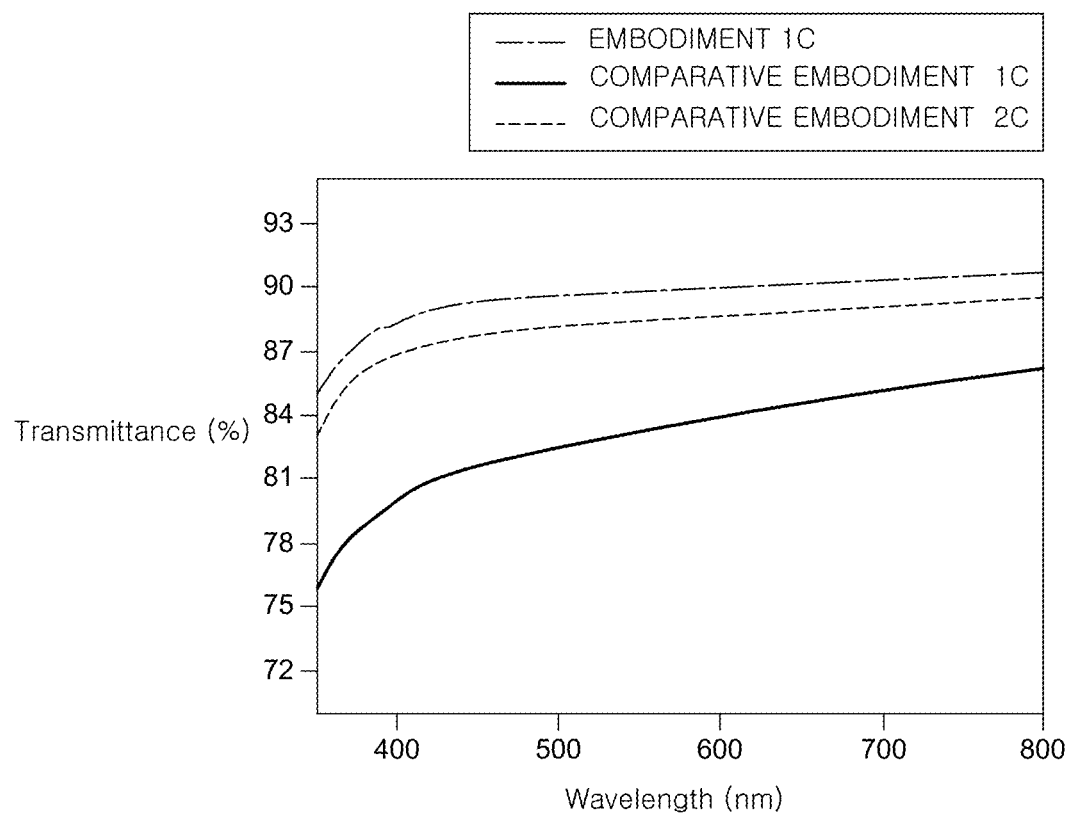
FIG. 6C is a graph showing transmittances of dam structures according to Embodiment 1C, Comparative Embodiment 1C and Comparative Embodiment 2C in a visible wavelength range.
Figure 6D:
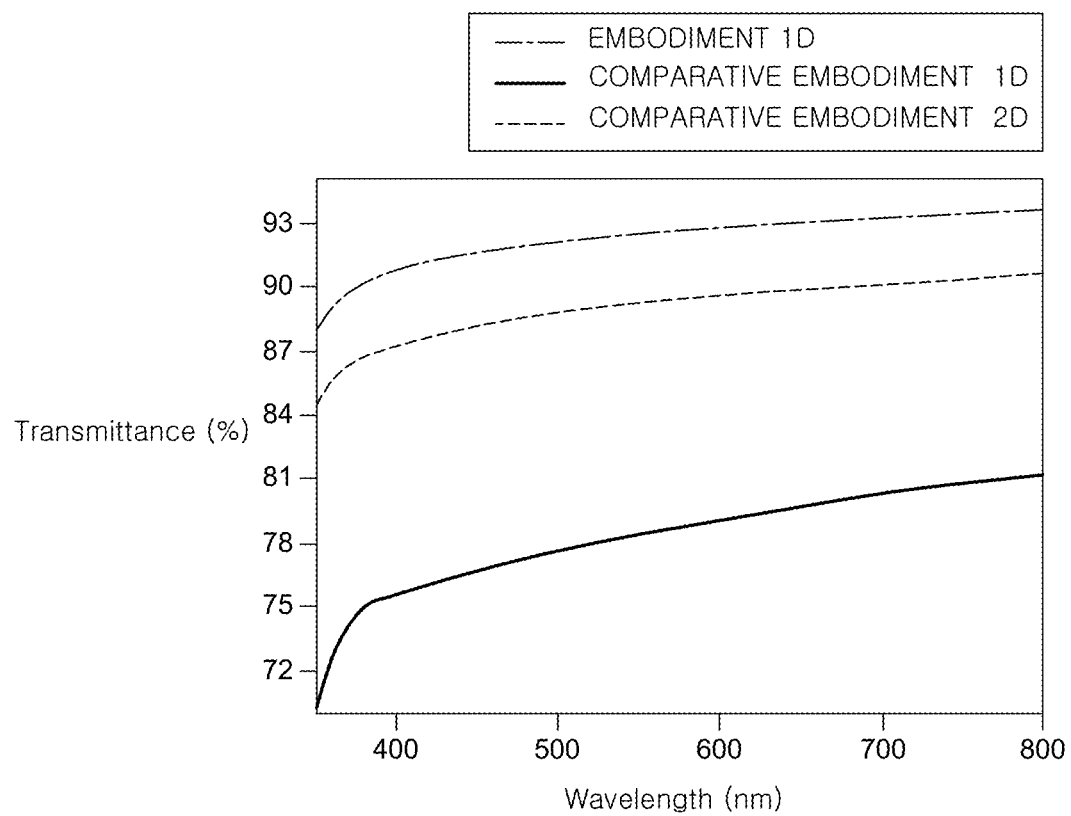
FIG. 6D is a graph showing transmittances of dam structures according to Embodiment 1D, Comparative Embodiment 1D and Comparative Embodiment 2D in a visible wavelength range.

FIG. 6A is a graph showing transmittances of dam structures according to Embodiment 1A, Comparative Embodiment 1A and Comparative Embodiment 2A in a visible wavelength range. FIG. 6B is a graph showing transmittances of dam structures according to Embodiment 1B, Comparative Embodiment 1B and Comparative Embodiment 2B in a visible wavelength range. FIG. 6C is a graph showing transmittances of dam structures according to Embodiment 1C, Comparative Embodiment 1C and Comparative Embodiment 2C in a visible wavelength range. FIG. 6D is a graph showing transmittances of dam structures according to Embodiment 1D, Comparative Embodiment 1D and Comparative Embodiment 2D in a visible wavelength range.

TABLE 1

| Classification | Type of Getter (Surface Modifier) | Amount of Getter | Transmittance (at 550 nm) | Haze |
|---|---|---|---|---|
| Embodiment 1A | Preparation Embodiment 2 (TPDT, AHM) | 1 wt % | 98.26% | 0.6% |
| Embodiment 1B |  | 2 wt % | 97.20% | 1.3% |
| Embodiment 1C |  | 3 wt % | 94.93% | 2.2% |
| Embodiment 1D |  | 5 wt % | 92.48% | 3.3% |
| Comparative Embodiment 1A | Preparation Embodiment 1 | 1 wt % | 96.05% | 1.3% |
| Comparative Embodiment 1B |  | 2 wt % | 94.25% | 2.6% |
| Comparative Embodiment 1C |  | 3 wt % | 88.21% | 5.3% |
| Comparative Embodiment 1D |  | 5 wt % | 78.39% | 8.1% |
| Comparative Embodiment 2A | Preparation Embodiment 3 (MPS) | 1 wt % | 98.16% | 0.6% |
| Comparative Embodiment 2B |  | 2 wt % | 95.06% | 1.4% |
| Comparative Embodiment 2C |  | 3 wt % | 93.51% | 2.7% |
| Comparative Embodiment 2D |  | 5 wt % | 89.22% | 3.7% |

Referring to Table 1 and FIG. 6A through FIG. 6D, it may be seen that Embodiments 1A through 1D in which the magnesium oxide particles whose surfaces were modified with TPDP and AHM were used as a getter show a higher transmittance and a lower haze than Comparative Embodiments 1A through 1D and Comparative Embodiments 2A through 2D under the same amount of the getter.

It may be seen that Comparative Embodiments 1A through 1D and Comparative Embodiments 2A through 2D show a great decrease in transmittance and a great increase in haze as the amount of the getter increases. If the surface-unmodified magnesium oxide particles are contained, it may be seen that when the getter is contained at 3 wt % as shown in Comparative Embodiment 1C, the transmittance decreases to less than 90% and the haze increases to 5% or more. Also, if the magnesium oxide particles whose surfaces were modified with MPS are contained, it may be seen that when the getter is contained at 5 wt % as shown in Comparative Embodiment 2D, the transmittance decreases to less than 90%.

Unlike the above cases, if the magnesium oxide particles whose surfaces were modified with TPDT and AHM are contained as shown in Embodiment 1D, it may be seen that even when the getter is contained at 5 wt %, the transmittance is as high as 90% or more and the haze is as low as 3.5% or less. Thus, it may be seen that the optical properties are excellent.

Figure 7:
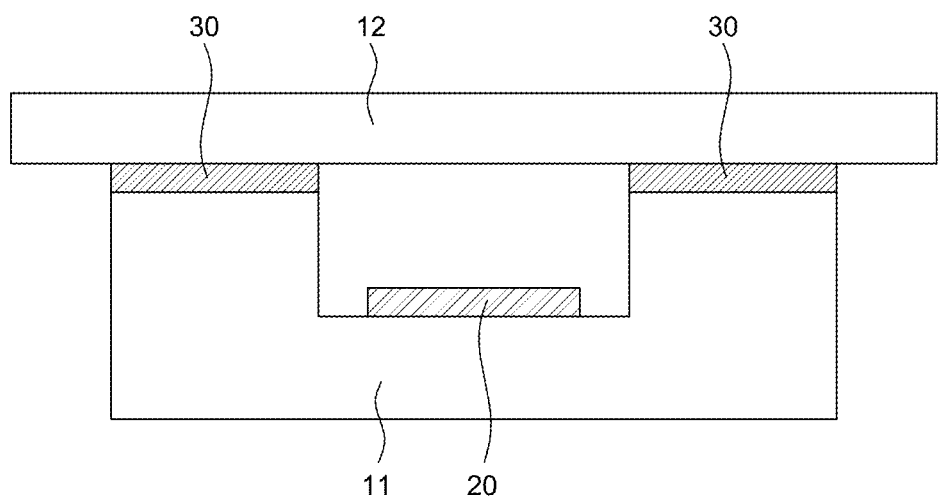
FIG. 7 is a schematic cross-sectional view of a sample prepared to evaluate resistance to water permeation.

Referring to the results of Embodiment 1A, Comparative Embodiment 1A and Comparative Embodiment 2A, the surface-modified Embodiment 1A and Comparative Embodiment 2A show a higher transmittance and a lower haze than the surface-unmodified Comparative Embodiment 1A. Thus, it may be seen that the optical properties are excellent. This is the result of improvement in dispersibility of a getter in a base resin caused by a strong chemical bond between a methacrylate group of the getter introduced by a surface modifier and the acrylic-based base resin.

to water permeation was measured. Specifically, referring to FIG. 7, dry cobalt chloride paper 20 used to test for water permeation was located on a lower substrate 11, and a dam-forming composition was coated along a side surface of the lower substrate 11. Thereafter, an upper substrate 12 was bonded thereto and then, the dam-forming composition was cured by irradiation with UV dose of 70 mJ/cm$^2$ from a UV lamp for 20 seconds to form a dam structure 30 having a width of 5 mm. Finally, a sample as shown in FIG. 7 was manufactured. The manufactured samples were located in a thermo-hygrostat set to a temperature of 85° C. and a relative humidity of 85% and the changes in color of the cobalt chloride paper were observed with the naked eye. The resistance to water permeation was evaluated based on the time taken by the cobalt chloride paper to change its color.

TABLE 2

| Classification | Embodiment 1D | Comparative Embodiment 1D | Comparative Embodiment 2D | Comparative Embodiment 3 |
|---|---|---|---|---|
| Type of Getter | MgO | MgO | MgO | CaO |
| Surface Treatment Agent | TPDT, AHM | — | MPS | — |
| Maximum Amount of Water Absorption (%) | 38.7 | 52.0 | 25.8 | 16.8 |
| Transmittance (%) | 92.5 | 78.4 | 89.2 | 46.5 |
| Haze (%) | 3.3 | 8.1 | 3.7 | 45.7 |
| Resistance to Water Permeation (Hour) | 360 | 270 | 220 | 150 |

Meanwhile, comparing to the results of Embodiment 1A and Comparative Embodiment 2A, it may be seen that when the getter is contained at 1 wt %, the two samples are similar in transmittance and haze. However, it may be seen that as for the magnesium oxide particles whose surfaces were modified with MPS according to Comparative Embodiment 2, the optical properties are sharply degraded as the amount of the getter increases. Unlike this case, as for the magnesium oxide particles whose surfaces were modified with TPDT and AHM according to Embodiment 1, a rate of degradation in optical properties is remarkably small even when the amount of the getter increases. Thus, Embodiment 1 shows a light transmittance of 92% or more and a low haze of 3.5% or less even when the getter is contained at 5 wt %. Therefore, it may be seen that the optical properties of Embodiment 1 are maintained high.

Experimental Embodiment 3

The maximum amount of water absorption, resistance to water permeation, transmittance and haze of dam structures made of the dam-forming compositions of Embodiment 1D, Comparative Embodiment 1D, Comparative Embodiment 2D and Comparative Embodiment 3 were measured. The measurement results were as shown in Table 2.

The maximum amount of water absorption was measured using a dynamic vapor sorption equipment in the same manner as in Experimental Embodiment 1 described above, and the transmittance and haze were measured in the same manner as in Experimental Embodiment 2 described above.

Samples were manufactured using the dam-forming compositions of Embodiment 1D, Comparative Embodiment 1D, Comparative Embodiment 2D and Comparative Embodiment 3 as shown in FIG. 7 and then, the resistance Referring to Table 2 above, it may be seen that Comparative Embodiment 3 containing the calcium oxide nanoparticles conventionally used as a getter and Comparative Embodiment 1D containing the surface-unmodified magnesium oxide nanoparticles show significantly lower water absorption properties and optical properties than Embodiment 1D.

Meanwhile, as for the magnesium oxide particles whose surfaces were modified with MPS according to Comparative Embodiment 2D, the compatibility with the base resin increases due to surface modification. Thus, Comparative Embodiment 2D shows improved optical properties compared to Comparative Embodiment 1D and Comparative Embodiment 3, but shows a low maximum amount of water absorption and a low resistance to water permeation. Therefore, it may be seen that Comparative Embodiment 2D does not have excellent waterproofing properties.

Unlike this, it may be seen that Embodiment 1D containing the magnesium oxide particles whose surfaces were modified with TPDT and AHM shows a high maximum amount of water absorption and the most excellent resistance to water permeation. Also, it may be seen that Embodiment 1D has excellent optical properties. Accordingly, it may be seen that if a getter according to Embodiments is contained in a dam structure and/or a filling part, it is possible to maintain a high transmittance of an organic light emitting display device and suppress permeation of water from the outside. Also, it is possible to make a moving path of water complicated and thus possible to delay the advance of water toward an OLED. Therefore, the transparency of the organic light emitting display device may be improved. Also, the display quality, durability and lifespan of the organic light emitting display device may be improved.

The exemplary embodiments of the present disclosure can also be described as follows:

According to an aspect of the present disclosure, an organic light emitting display device includes a first substrate which includes a plurality of sub-pixels and in which a display area and a non-display area that encloses the display area are defined, a thin film transistor disposed on the first substrate, an organic light emitting diode disposed on the thin film transistor, a second substrate facing the first substrate, a filling part filling a space between the second substrate and the organic light emitting diode, and a dam structure disposed in the non-display area and surrounding the filling part, wherein at least one of the dam structure and the filling part includes a getter, and the getter is composed of magnesium oxide particles whose surfaces are modified into a first surface modification part made of an amino silane-based compound and a second surface modification part bound to the first surface modification part and made of a compound containing an acrylate group and a methacrylate group.

The magnesium oxide particles may have an average diameter of from 10 nm to 300 nm.

The amino silane-based compound may include at least one selected from 3-(trimethoxysilylpropyl)diethylenetriamine, (3-aminopropyl)trimethoxysilane, 1-3-(trimethoxysilyl)propyl urea, (3-aminopropyl)triethoxysilane, 3-aminopropyl-methyl-diethoxysilane, N-3-(trimethoxysilyl)propyl ethylenediamine and N-(3-(dimethoxymethylsilyl)propyl ethylenediamine).

The compound containing the acrylate group and the methacrylate group may be 3-(acryloyloxy)-2-hydroxypropyl methacrylate.

An amine group of the amino silane-based compound and the acrylate group of the compound containing the acrylate group and the methacrylate group may be chemically bound to each other through a Michael addition reaction.

At least one of the dam structure and the filling part may include the getter and a base resin having a functional group to be bound to the getter.

The base resin may be an acrylic-based resin and the functional group to be bound to the getter may be a (met)acrylate group.

The getter may be contained at a ratio of from 0.5 wt % to 20 wt % based on a total weight of the base resin and the getter.

The dam structure may further include a spacer and a filler.

The filling part may further include a filler.

The first substrate may include a plurality of sub-pixels in the display area, and the organic light emitting diode emits white light, and the organic light emitting display device may further include a color filter disposed in a part of the second substrate.

Each of the plurality of sub-pixels may include an emissive area and a transmissive area.

The organic light emitting diode may include an anode disposed on the thin film transistor, a white organic emission layer disposed on the anode and a cathode disposed on the white organic emission layer, and the anode may overlap with the emissive area and the white organic emission layer may overlap with the emissive area and the transmissive area.

It will be apparent to those skilled in the art that various modifications and variations can be made in the organic light emitting display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light emitting display device, comprising:
a first substrate which includes a plurality of sub-pixels and in which a display area and a non-display area that encloses the display area are defined;
a thin film transistor disposed on the first substrate;
an organic light emitting diode disposed on the thin film transistor;
a second substrate facing the first substrate;
a filling part filling a space between the second substrate and the organic light emitting diode; and
a dam structure disposed in the non-display area and surrounding the filling part,
wherein at least one of the dam structure and the filling part includes a getter, and
the getter is composed of magnesium oxide particles whose surfaces are modified into a first surface modification part made of an amino silane-based compound and a second surface modification part bound to the first surface modification part and made of a compound containing an acrylate group and a methacrylate group.

2. The organic light emitting display device according to claim 1, wherein the magnesium oxide particles have an average diameter of from 10 nm to 300 nm.

3. The organic light emitting display device according to claim 1, wherein the amino silane-based compound includes at least one selected from 3-(trimethoxysilylpropyl)diethylenetriamine, (3-aminopropyl)trimethoxysilane, 1-3-(trimethoxysilyl)propyl urea, (3-aminopropyl)triethoxysilane, 3-aminopropyl-methyl-diethoxysilane, N-3-(trimethoxysilyl)propyl ethylenediamine and N-(3-(dimethoxymethylsilyl)propyl ethylenediamine).

4. The organic light emitting display device according to claim 1, wherein the compound containing the acrylate group and the methacrylate group is 3-(acryloyloxy)-2-hydroxypropyl methacrylate.

5. The organic light emitting display device according to claim 1, wherein an amine group of the amino silane-based compound and the acrylate group of the compound containing the acrylate group and the methacrylate group are chemically bound to each other through a Michael addition reaction.

6. The organic light emitting display device according to claim 1, wherein at least one of the dam structure and the filling part includes the getter and a base resin having a functional group to be bound to the getter.

7. The organic light emitting display device according to claim 6, wherein the base resin is an acrylic-based resin and the functional group to be bound to the getter is a (met)acrylate group.

8. The organic light emitting display device according to claim 6, wherein the getter is contained at a ratio of from 0.5 wt % to 20 wt % based on a total weight of the base resin and the getter.

9. The organic light emitting display device according to claim 1, wherein the dam structure further includes a spacer and a filler.

10. The organic light emitting display device according to claim 1, wherein the filling part further includes a filler.

11. The organic light emitting display device according to claim 1, wherein the first substrate includes a plurality of sub-pixels in the display area, and
the organic light emitting diode emits white light, and
the organic light emitting display device further includes a color filter disposed in a part of the second substrate.

12. The organic light emitting display device according to claim 11, wherein each of the plurality of sub-pixels includes an emissive area and a transmissive area.

13. The organic light emitting display device according to claim 12, wherein the organic light emitting diode includes an anode disposed on the thin film transistor, a white organic emission layer disposed on the anode and a cathode disposed on the white organic emission layer, and
the anode overlaps with the emissive area and the white organic emission layer overlaps with the emissive area and the transmissive area.

\* \* \* \* \*